(12) United States Patent
Gangl et al.

(10) Patent No.: US 6,557,132 B2
(45) Date of Patent: Apr. 29, 2003

(54) METHOD AND SYSTEM FOR DETERMINING COMMON FAILURE MODES FOR INTEGRATED CIRCUITS

(75) Inventors: David V. Gangl, Essex Junction, VT (US); Matthew Sean Grady, Burlington, VT (US); David John Iverson, Underhill, VT (US); Kenneth A. Lavallee, Colchester, VT (US); Robert Edward Shearer, Richmond, VT (US)

(73) Assignee: International Business Machines Corporation, Armonk, NY (US)

( * ) Notice: Subject to any disclaimer, the term of this patent is extended or adjusted under 35 U.S.C. 154(b) by 147 days.

(21) Appl. No.: 09/791,004

(22) Filed: Feb. 22, 2001

(65) Prior Publication Data

US 2002/0116675 A1 Aug. 22, 2002

(51) Int. Cl.$^7$ .............................................. G01R 31/28
(52) U.S. Cl. ...................................... 714/736; 714/732
(58) Field of Search ................................ 714/736, 732, 714/733, 734, 738, 718, 724, 728, 819, 45; 377/54

(56) References Cited

U.S. PATENT DOCUMENTS

| | | | |
|---|---|---|---|
| 4,150,331 A | 4/1979 | Lacher | |
| 4,216,374 A | 8/1980 | Lam et al. | |
| 4,503,536 A | 3/1985 | Panzer | |
| 4,519,078 A | 5/1985 | Komonytsky | |
| 4,601,033 A | 7/1986 | Whelan | |
| 4,801,870 A | 1/1989 | Eichelberger et al. | |
| 4,817,093 A | 3/1989 | Jacobs et al. | |
| 5,144,230 A | * 9/1992 | Katoozi et al. | 324/537 |
| 5,412,665 A | 5/1995 | Gruodis et al. | |
| 5,515,384 A | 5/1996 | Horton, III | |
| 5,561,760 A | 10/1996 | Ferris et al. | |
| 5,568,437 A | * 10/1996 | Jamal | 365/189.07 |
| 5,583,786 A | 12/1996 | Needham | |
| 5,612,963 A | 3/1997 | Koenemann et al. | |
| 5,642,362 A | 6/1997 | Savir | |
| 5,831,988 A | * 11/1998 | Fagerness | 714/718 |
| 5,968,194 A | 10/1999 | Wu et al. | |
| 5,983,380 A | 11/1999 | Motika et al. | |
| 6,021,514 A | 2/2000 | Koprowski | |
| 6,438,722 B1 | * 8/2002 | Bailey et al. | 714/736 |

* cited by examiner

Primary Examiner—Christine T. Tu
(74) Attorney, Agent, or Firm—Robert A. Walsh; Cantor Colburn LLP

(57) ABSTRACT

A method for determining common failure modes of an integrated circuit device under test is disclosed. In an exemplary embodiment of the invention, a test pattern is applied to a series of inputs of the device under test. A set of output data generated by the device under test is then compared to a set of expected data, with the set of output data being generated by the device under test in response to the test pattern. It is then determined whether the set of output data has passed the test, with the set of output data passing the test if the set of output data matches the set of expected data. If the set of output data has not passed the test, then it is determined whether an output signature corresponding to the set of output data matches a previously stored output signature. Fail data corresponding to the output signature is then stored if the output signature matches a previously stored output signature.

13 Claims, 3 Drawing Sheets

METHOD AND SYSTEM FOR DETERMINING COMMON FAILURE MODES FOR INTEGRATED CIRCUITS

BACKGROUND OF THE INVENTION

The present invention relates generally to the testing of semiconductor integrated circuit devices and, more particularly, to an improved method and system for determining common failure modes for test data applied to an integrated circuit device under test.

Complex very large scale integrated circuit (VLSI) devices fabricated upon a single semiconductor chip contain thousands of functional circuit elements which are generally inaccessible for testing purposes. Because of the complexity of the internal connections and their combinational interdependencies, testing of such devices becomes increasingly cumbersome as the number of circuit elements increases. For example, a semiconductor chip with 50 input terminals has $2^{50}$ possible digital input combinations. Thus, applying that many input patterns during testing and then comparing the resulting output responses to a set of expected outputs is a task too cumbersome for modern production testing.

Consequently, a known testing protocol involves the generation of pseudo-random patterns or test vectors to considerably reduce the number of test patterns required to test a circuit. In Weighted Random Pattern (WRP) generation, differently configured sequences of random patterns are applied in parallel to each input terminal of a Device Under Test (DUT). The output responses of the patterns are then collected from each output in parallel and then combined so as to obtain a "signature function" of all the sequences of parallel outputs. These test signatures are then compared with corresponding known "good" signatures obtained by computer simulation, thereby obviating the need to compare each individual test response to a known good output response.

In addition to reducing testing time, it is also desirable to ascertain the specific failure mode of a device. Common failure modes (as opposed to random failures), are generally symptomatic of conditions such as manufacturing process problems or design defects. Accordingly, discovering and eliminating common failure modes is important in improving device yield. Thus, when reviewing the signatures of failed vectors, it is desirable to know whether a recognizable pattern of signatures exists, thereby indicting a common failure mode or modes.

In order to detect repeating vector fails from one device to the next, previous testing methods have captured the failing vector states and locations and compared the same to find similarities. However, such a technique necessarily uses some implementation of pattern recognition function. Moreover, the collection of failed vector data typically takes a considerable amount of time. Not only are multiple testing resources accessed during this process, but the fail capturing mechanism of most testing devices is orders of magnitude smaller than the testing vector resources. As a result, the multiple execution of patterns is required to collect all of the failing vectors.

SUMMARY OF THE INVENTION

The above discussed and other drawbacks and deficiencies of the prior art are overcome or alleviated by a method for determining common failure modes of an integrated circuit device under test. In an exemplary embodiment of the invention, a test pattern is applied to a series of inputs of the device under test. A set of output data generated by the device under test is then compared to a set of expected data, with the set of output data being generated by the device under test in response to the test pattern. It is then determined whether the set of output data has passed the test, with the set of output data passing the test if the set of output data matches the set of expected data. If the set of output data has not passed the test, then it is determined whether an output signature corresponding to the set of output data matches a previously stored output signature. Fail data corresponding to the output signature is then stored if the output signature matches a previously stored output signature.

In a preferred embodiment, the output signature is stored if the output signature does not match a previously stored output signature. An indication signal is also generated if the fail data corresponding to the output signature has been stored. Preferably, the output signature is created by a series of single input shift registers connected to a series of outputs of the device under test.

BRIEF DESCRIPTION OF THE DRAWINGS

Referring to the exemplary drawings wherein like elements are numbered alike in the several Figures.

DETAILED DESCRIPTION OF THE INVENTION

Figure 1:
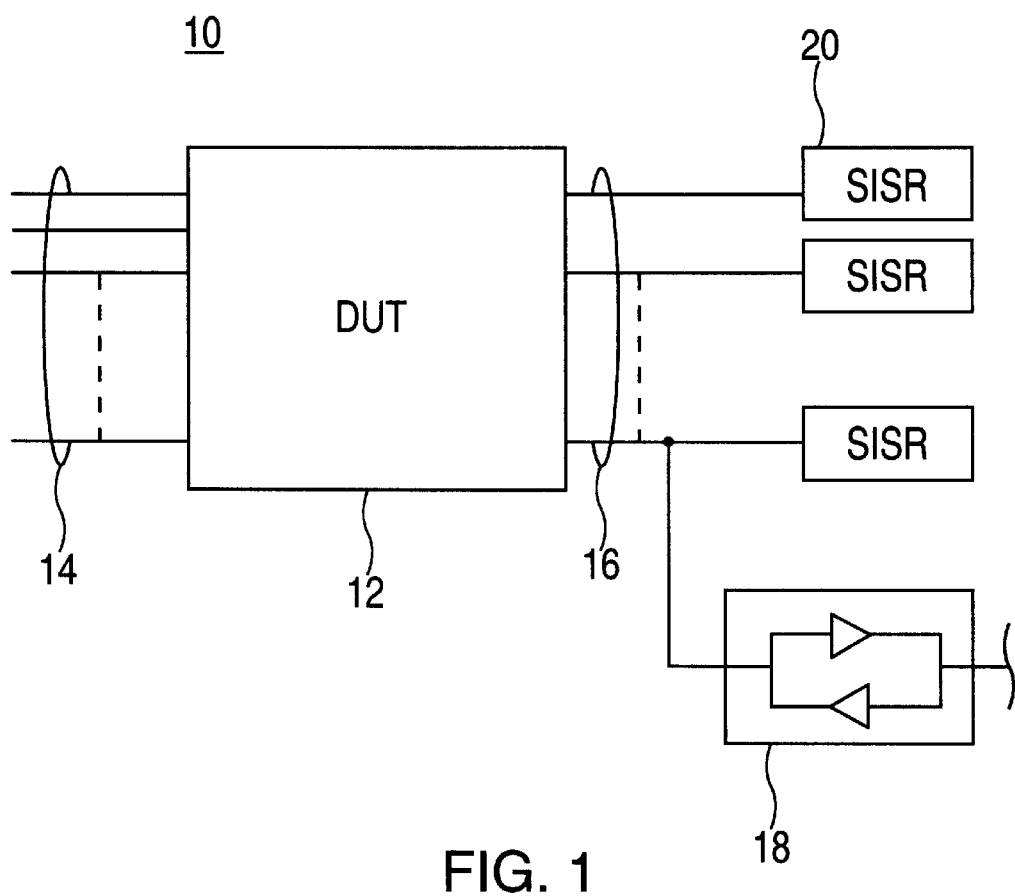
FIG. 1 is a schematic diagram illustrating a system for determining common failure modes of an integrated circuit device under test, in accordance with an embodiment of the invention.

Referring initially to FIG. 1, there is shown a system 10 for determining common failure modes of an integrated circuit device under test 12. The device under test 12 has a series of input terminals or pins 14 which may receive a test input pattern or patterns thereto. A series of output terminals or pins 16 of device 12 are monitored by tester circuit 18 which, among other functions, monitors the output responses and vectors of device 12 generated in response to input stimuli. Although FIG. 1 shows tester circuit 18 connected to only one of the output pins 16, it should be understood that each output pin 16 is also connected to tester circuit 18. It will also be appreciated by those skilled in the art that output pins 16 may also include one or more of the input pins 14. In other words, certain pins may be both input pins 14 and output pins 16 (bi-directional pins).

In addition to the tester circuit IS8 which is connected to the output pins 16, a series of single input shift registers (SISRs) 20 are also connected to the output pins 16 of device under test 12. The SISRs 20 are used as signature generators which create signatures representing vector states of failing test devices 12. In the embodiment shown, the SISRs 20 are preferably already included within a test pattern generating device (not shown). The test pattern generating device may include a weighted random pattern generator (not shown) which further includes SISRs 20. As described previously, a WRP generator applies a statistically predetermined greater number of binary ones or zeros to selected inputs of the device under test 12.

Once the SISRs 20 are connected to each output pin 16 and bi-directional pin, an initial seed value is initialized in each register. The seed value is preferably binary zero for each register, and is initialized as such before each test pattern is executed.

Figure 2:
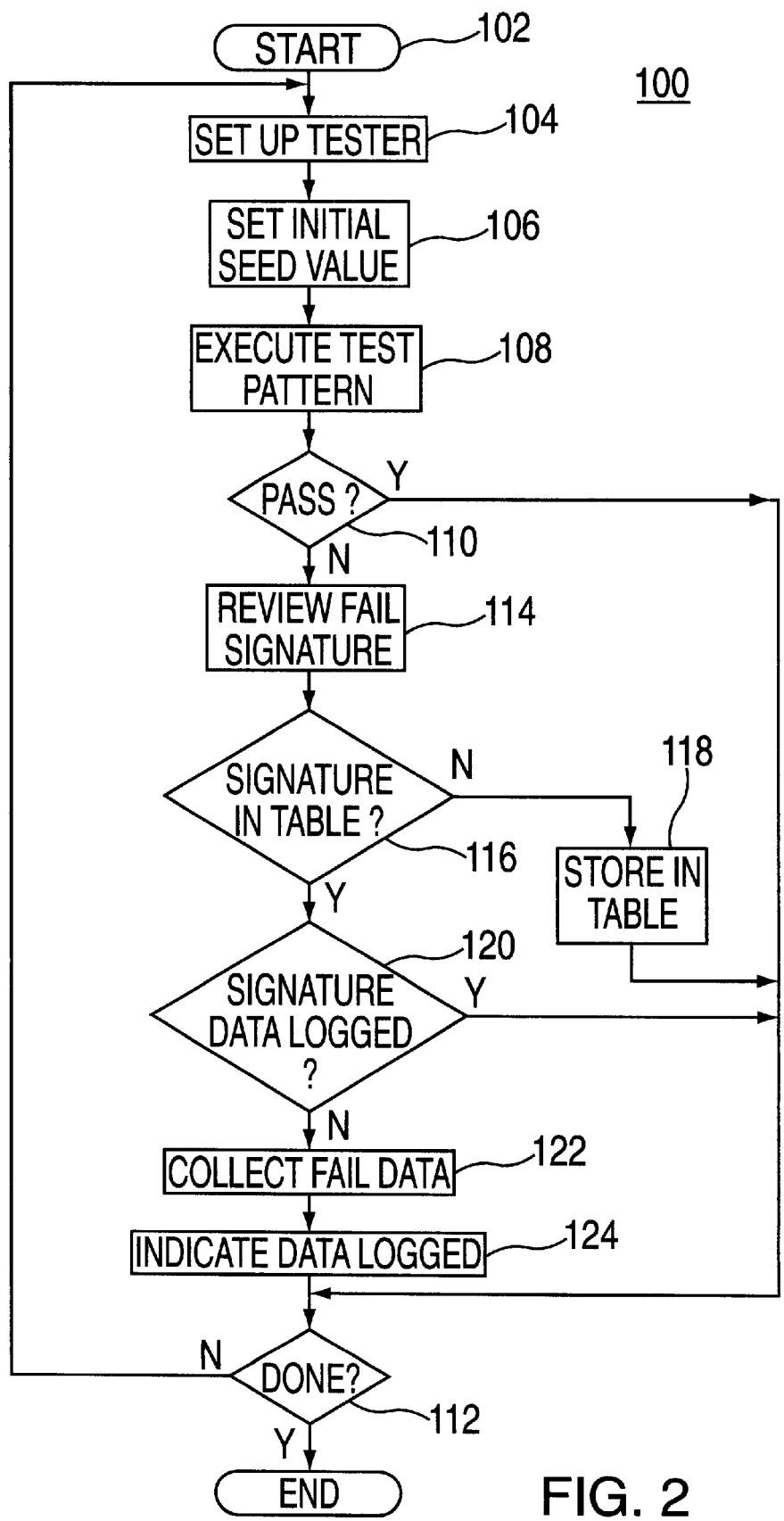
FIG. 2 is a flow diagram illustrating a method for determining common failure modes of an integrated circuit device under test, in accordance with another embodiment of the invention.

Referring now to FIG. 2, there is shown a flow diagram illustrating a method 100 for determining common failure modes of an integrated circuit device under test. By way of example, the method may be implemented with the system depicted in FIG. 1. Method 100 begins at start block 102 and proceeds to block 104 where the tester circuitry is set up. As shown in FIG. 1, this includes connecting the series of SISRs 20 to each output (and bi-directional output) pin 16 of the device under test 12. Method 100 then proceeds to block 106 where the initial seed value for each SISR 20 (preferably logic "0") is set. At block 108, an appropriate test pattern is created and applied to the input pins 14 of the device under test 12. It is then determined at decision block 110 whether the device 12 has passed the test. A device under test passes the test if the set of output data generated by the device under test matches a set of expected output data for a given set of inputs. If it is determined that the device 12 has passed the test, then method 100 skips down to decision block 112 to see whether the testing process is completed for each device. However, if the device 12 has failed the test, then method 100 proceeds to block 114 where a fail output signature is reviewed. The fail output signature is a compressed version of the entire set of output data, and is created by the SISRs 20. Specifically, the fail output signature is compared to previously stored fail output signatures to see whether the present fail output signature matches any of the previously stored fail output signatures. Fail output signatures created by SISRs 20 may be stored in a database or look up table (not shown) for future comparison with newly created output signatures.

If it is determined at decision block 116 that the present fail output signature does not match any previously stored fail output signatures, then the present fail output signature is stored for future reference at block 118. Method 100 then skips down to decision block 112. On the other hand, a match between the present fail output signature and a previously stored fail output signature is indicative of a common mode failure. Accordingly, method 100 then proceeds to decision block 120 to check whether the present fail output signature data has been "logged" (i.e., the vector numbers, pin states and other data corresponding to the signature value have been collected). If the signature data has already been logged, method 100 skips to decision block 112. If not, the signature data is logged for farther post-testing analysis at block 122. When signature data is newly logged, an indication signal confirming the same may be generated at block 124. Finally, method 100 eventually reaches decision block 112 where the process is repeated with a new device to be tested until such time as all devices have been tested.

It will be seen from the foregoing description that the above method quickly identifies common fail modes during the normal execution of DUT vectors. By using the signature generation capability built into the tester, such as the SISRs 20 used to support WRPT, a comparison is performed of only the unique fail signatures generated by the SISRs 20 without the use of complicated pattern recognition processes. Post-processing of the fail data is therefore greatly simplified, since the technique for identifying common fail modes involves looking for repeating values generated by DUT signatures as opposed to all of the vector data represented by the signatures.

Figure 3:
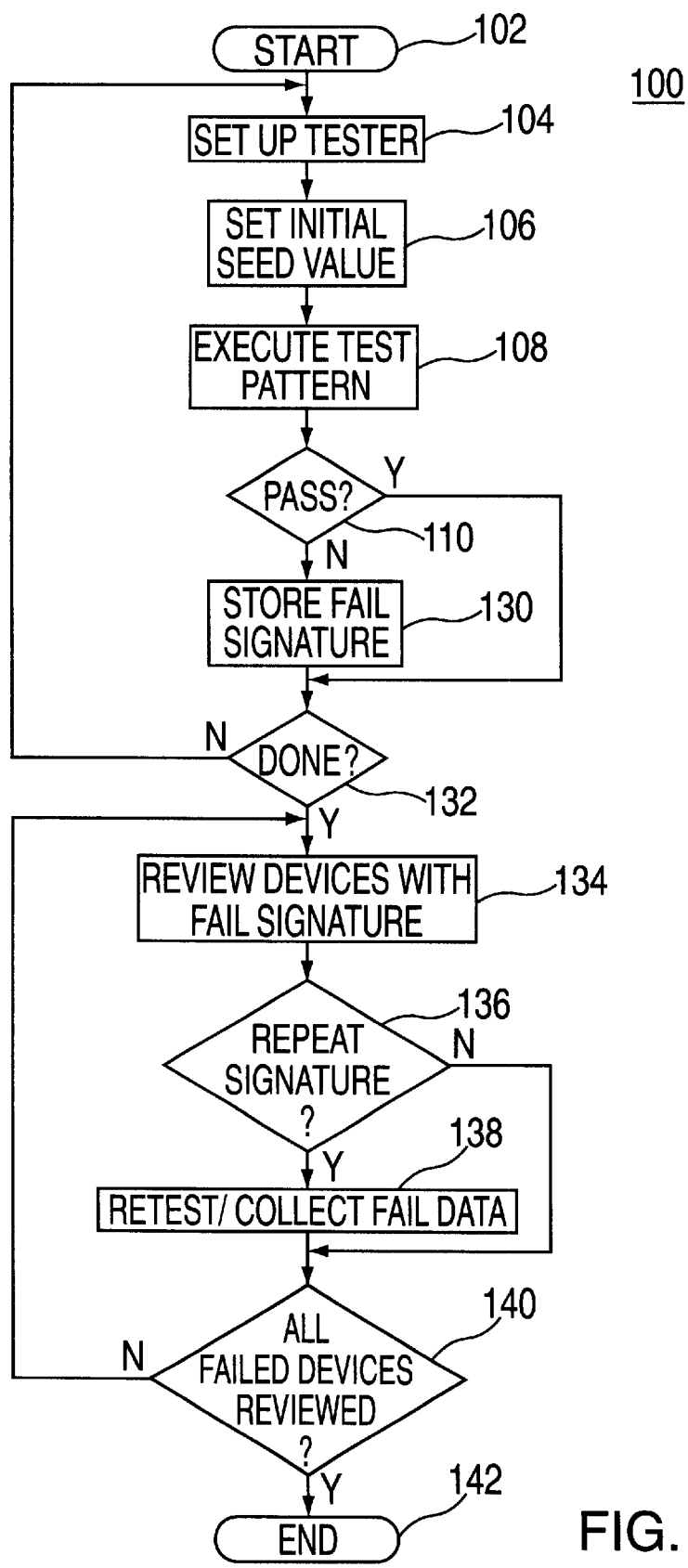
FIG. 3 is flow diagram illustrating an alternative embodiment of the method shown in FIG. 2.

Referring now to FIG. 3, an alternative embodiment of method 100 is illustrated. Blocks 102 through 110 are initially the same as the embodiment in FIG. 2. If at decision block 110, the device under test fails, then the fail signature is automatically stored at block 130. This process is repeated until all devices have been tested. Once all devices have been tested, method 100 proceeds from decision block 132 to block 134 where a review process takes place. Each failed device has its signature reviewed to see whether it is unique with respect to the signatures of other failed devices. If a device is found to have a "repeat" fail signature at decision block 136, then that device is retested and its fail data collected at block 138 (assuming the device exhibits a consistent fail signature when retested). After decision block 140 determines that all failed devices have had their signatures reviewed, method 100 comes to an end at end block 142.

By gathering data from the repeating signatures of failed test devices, a diagnosis as to the possible failure cause(s) may be undertaken. Once again, it has been shown that a comparison of signatures to check for repeat fail signatures rather than comparing entire vector states results in faster identification of common mode failures. Because the time required to generate and capture such information is relatively small, larger sample sizes can be generated, thereby allowing extra data to be captured with less overhead for data collection. Furthermore, the above disclosed embodiments of the invention are applicable to several different types of testing modes including, but not limited to Logic Built In Self Test (LBIST), Array Built In Self Test (ABIST), Scan Chain, functional, and stuck-fault.

The present invention can include embodiments in the form of computer-implemented processes and apparatuses for practicing those processes. The present invention can also include embodiments in the form of computer program code containing instructions embodied in tangible media, such as floppy diskettes, CD-ROMs, hard drives, or any other computer-readable storage medium, wherein, when the computer program code is loaded into and executed by a computer, the computer becomes an apparatus for practicing the invention. The present invention can also include embodiments in the form of computer program code, for example, whether stored in a storage medium, loaded into and/or executed by a computer, or transmitted over some transmission medium, such as over electrical wiring or cabling, through fiber optics, or via electromagnetic radiation, wherein, when the computer program code is loaded into and executed by a computer, the computer becomes an apparatus for practicing the invention. When implemented on a general-purpose microprocessor, the computer program code segments configure the microprocessor to create specific logic circuits.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for determining common failure modes of an integrated circuit device under test, the method comprising:

applying a test pattern to a series of inputs of the device under test;

comparing a set of output data generated by the device under test to a set of expected output data, said set of output data generated by the device under test in response to said test pattern;

determining whether said set of output data generated by the device under test has passed the test, said set of output data passing the test if said set of output data matches said set of expected data being pass data if said output data does not match said set of expected data being fail data; and if said set of output data has not passed the test, then:
  determining whether an output signature corresponding to said set of output data matches a previously stored output signature; and
  storing fail data corresponding to said output signature if said output signature matches a previously stored output signature.

2. The method of claim 1, further comprising storing said output signature if said output signature does not match a previously stored output signature.

3. The method of claim 1, further comprising generating an indication signal if said fail data corresponding to said output signature has been stored.

4. The method of claim 1, wherein said output signature is created by a series of single input shift registers connected to a series of outputs of the device under test.

5. A method for determining common failure modes of a quantity of integrated circuit devices under test, the method comprising:

applying a test pattern to a series of inputs of each device under test;

comparing a set of output data of a particular device under test to a set of expected data, said set of output data generated by the particular device under test in response to said test pattern;

determining whether said set of output data generated by the device under test has passed the test, said set of output data passing the test if said set of output data matches said set of expected data being pass data if said set of output data does not match said set of expected data being fail data;

storing an output signature corresponding to said set of output data if said set of output data has not passed the test;

determining whether any stored output signatures are repeating stored signatures, wherein a specific stored output signature is a repeating stored signature if said specific stored output signature has been stored more than once;

retesting each device having a repeated stored signature; and collecting fail data corresponding to said repeated stored signature of each device retested.

6. A storage medium encoded with a machine readable computer program code for determining common failure modes of an integrated circuit device under test, the storage medium including instructions for causing a computer to implement a method, the method comprising:

applying a test pattern to a series of inputs of the device under test;

comparing a set of output data generated by the device under test to a set of expected output data, said set of output data generated by the device under test in response to said test pattern;

determining whether said set of output data generated by the device under test has passed the test, said set of output data passing the test if said set of output data matches said set of expected data being pass data if said set of output data does not match said set of output data being fail data; and if said set of output data has not passed the test, then:
  determining whether an output signature corresponding to said set of output data matches a previously stored output signature; and
  storing fail data corresponding to said output signature if said output signature matches a previously stored output signature.

7. The storage medium of claim 6, further comprising storing said output signature if said output signature does not match a previously stored output signature.

8. The storage medium of claim 6, further comprising generating an indication signal if said fail data corresponding to said output signature has been stored.

9. The storage medium of claim 6, wherein said output signature is created by a series of single input shift registers connected to a series of outputs of the device under test.

10. A computer data signal for determining common failure modes of an integrated circuit device under test, the computer data signal comprising code configured to cause a processor to implement a method, the method comprsing:

applying a test pattern to a series of inputs of the device under test;

comparing a set of output data generated by the device under test to a set of expected output data, said set of output data generated by the device under test in response to said test pattern;

determining whether said set of output data generated by the device under test has passed the test, said set of output data passing the test if said set of output data match said set of expected data being pass data if said set of output data does not match said set of output data being fail data; and if said set of output data has not passed the test, then:
  determining whether an output signature corresponding to said set of output data matches a previously stored output signature; and
  storing fail data corresponding to said output signature if said output signature matches a previously stored output signature.

11. The computer data signal of claim 10, further comprising storing said output signature if said output signature does not match a previously stored output signature.

12. The computer data signal of claim 10, further comprising generating an indication signal if said fail data corresponding to said output signature has been stored.

13. The computer data signal of claim 10, wherein said output signature is created by a series of single input shift registers connected to a series of outputs of the device under test.

* * * * *